(12) United States Patent
Saitoh et al.

(10) Patent No.: US 11,430,856 B2
(45) Date of Patent: Aug. 30, 2022

(54) DISPLAY DEVICE WITH ISLAND-SHAPED CONDUCTORS OVERLAPPING WIRING LINES IN BENDING PORTION

(71) Applicant: SHARP KABUSHIKI KAISHA, Sakai (JP)

(72) Inventors: Takao Saitoh, Sakai (JP); Masahiko Miwa, Sakai (JP); Yohsuke Kanzaki, Sakai (JP); Seiji Kaneko, Sakai (JP); Yi Sun, Sakai (JP); Masaki Yamanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 137 days.

(21) Appl. No.: 17/040,390

(22) PCT Filed: Mar. 27, 2018

(86) PCT No.: PCT/JP2018/012469
§ 371 (c)(1),
(2) Date: Sep. 22, 2020

(87) PCT Pub. No.: WO2019/186702
PCT Pub. Date: Oct. 3, 2019

(65) Prior Publication Data
US 2021/0057511 A1 Feb. 25, 2021

(51) Int. Cl.
*H01L 27/32* (2006.01)
*H01L 51/52* (2006.01)

(52) U.S. Cl.
CPC ...... *H01L 27/3276* (2013.01); *H01L 51/5253* (2013.01)

(58) Field of Classification Search
CPC .......... H01L 27/3276; H01L 51/5253
See application file for complete search history.

(56) References Cited

U.S. PATENT DOCUMENTS

| 2008/0289859 | A1  | 11/2008 | Mikado et al. |
| 2014/0217397 | A1* | 8/2014  | Kwak ................. H01L 51/0097 257/43 |
| 2014/0353670 | A1  | 12/2014 | Youn et al. |
| 2015/0287750 | A1  | 10/2015 | Youn et al. |
| 2017/0125505 | A1* | 5/2017  | Oh ...................... H01L 27/3276 |
| 2017/0194411 | A1* | 7/2017  | Park .................... H01L 51/5253 |
| 2017/0352717 | A1* | 12/2017 | Choi ................... H01L 51/0097 |

(Continued)

FOREIGN PATENT DOCUMENTS

| JP | 2005-353827 A | 12/2005 |
| JP | 2014-232300 A | 12/2014 |
| JP | 2017-187581 A | 10/2017 |

*Primary Examiner* — Lex H Malsawma
(74) *Attorney, Agent, or Firm* — ScienBiziP, P.C.

(57) ABSTRACT

In a bending portion, a slit that exposes a resin substrate is formed in at least one inorganic insulating film, a first flattening film is provided so as to fill in the slit, each of a plurality of wiring lines is provided on the first flattening film and both end portions of the inorganic insulating film, the slit being formed at both end portions, a second flattening film is provided on each of the wiring lines, a plurality of conductive layers each having an island shape are provided on the second flattening film, and each of the wiring lines and a corresponding conductive layer are electrically connected via contact holes formed in the second flattening film.

8 Claims, 7 Drawing Sheets

(56) References Cited

U.S. PATENT DOCUMENTS

2018/0286938 A1* 10/2018 Moon ................. H01L 27/1248
2018/0342707 A1* 11/2018 Lee ..................... H01L 51/5253
2018/0366586 A1* 12/2018 Son ..................... H01L 29/7869

* cited by examiner

DISPLAY DEVICE WITH ISLAND-SHAPED CONDUCTORS OVERLAPPING WIRING LINES IN BENDING PORTION

TECHNICAL FIELD

The disclosure relates to a display device.

BACKGROUND ART

In recent years, a self-luminous organic EL display device, which uses organic electroluminescent (EL) elements, has attracted attention as a display device that can replace liquid crystal display devices. As this type of organic EL display device, a flexible organic EL display device is proposed in which an organic EL element or the like is formed on a resin substrate having flexibility. Here, the organic EL display device is provided with a rectangular display region for displaying an image and a frame region formed around the display region, and there is a demand for reduction of the frame region. In the flexible organic EL display device, if the frame region is reduced by bending the frame region, there is a risk that wiring lines disposed in the frame region may break.

For example, PTL 1 discloses a flexible display device in which disconnection of wiring lines is prevented by forming a bending hole and thereby removing a part of each of a buffer film, a gate insulating film, and an interlayer insulating film each corresponding to a bending region.

CITATION LIST

Patent Literature

PTL 1: JP 2014-232300 A

SUMMARY

Technical Problem

Incidentally, in the flexible organic EL display device, inorganic insulating films, such as a base coat film, a gate insulating film, and an interlayer insulating film, are provided on a resin substrate. Thus, in order to suppress the disconnection of the wiring line disposed in the frame region, the inorganic insulating films may be removed on a bending portion of the frame region, to prevent the inorganic insulating films from being broken in the bending portion. Here, in the organic EL display device in which the inorganic insulating films are removed in the bending portion of the frame region, the disconnection of the wiring line disposed in the frame region can be suppressed, but if the wiring line breaks, there is a risk that the organic EL display device may not operate normally. Thus, there is room for improvement.

The disclosure has been made in light of the foregoing, and an object of the disclosure is to provide redundancy for a wiring line disposed in a frame region.

Solution to Problem

In order to achieve the object described above, a display device according to the disclosure includes a resin substrate, a TFT layer provided on the resin substrate, a light-emitting element provided on the TFT layer and configuring a display region, a frame region provided around the display region, a terminal portion provided on an end portion of the frame region, a bending portion provided extending in one direction between the display region and the terminal portion, at least one inorganic insulating film configuring the TFT layer and provided on the resin substrate, and a plurality of wiring lines configuring the TFT layer and provided, in the frame region, extending parallel to each other in a direction intersecting a direction in which the bending portion extends, in which, in the bending portion, a slit is formed penetrating through the at least one inorganic insulating film and exposing the resin substrate, a first flattening film is provided filling the slit, each of the plurality of wiring lines is provided on the first flattening film and on both of end portions of the at least one layer of the inorganic insulating film, the slit being formed at both the end portions, a second flattening film configuring the TFT layer is provided on each of the plurality of wiring lines, a plurality of conductive layers each having an island shape are provided on the second flattening film, and each of the plurality of wiring lines and a corresponding conductive layer of the plurality of conductive layers are electrically connected via a first contact hole and a second contact hole formed in the second flattening film.

Advantageous Effects of Disclosure

According to the disclosure, a second flattening film is provided on each wiring line, a plurality of conductive layers each having an island shape are provided on the second flattening film, and each of the wiring lines and a corresponding conductive layer are electrically connected via a first contact hole and a second contact hole formed in the second flattening film. Thus, it is possible to provide redundancy to the wiring lines disposed in the frame region.

DESCRIPTION OF EMBODIMENTS

Embodiments of the disclosure will be described below in detail with reference to the drawings. Note that the disclosure is not limited to the embodiments described below.

First Embodiment

Figure 1:
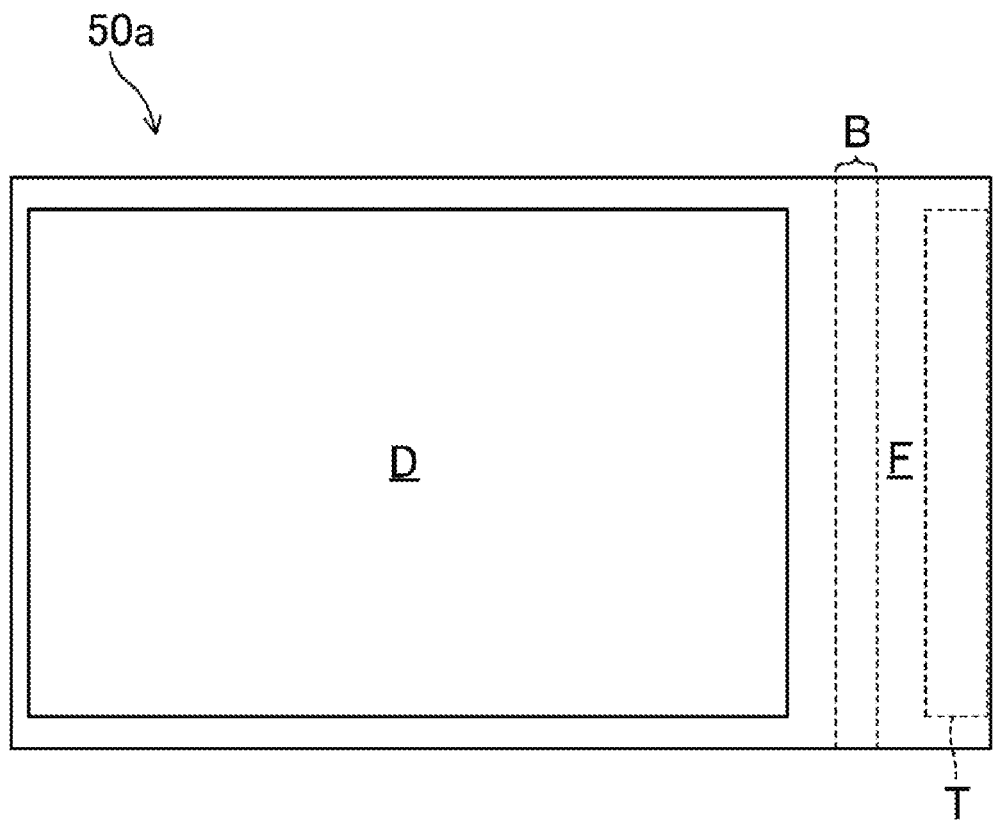
FIG. 1 is a plan view illustrating an overall configuration of an organic EL display device according to a first embodiment of the disclosure.
Figure 2:
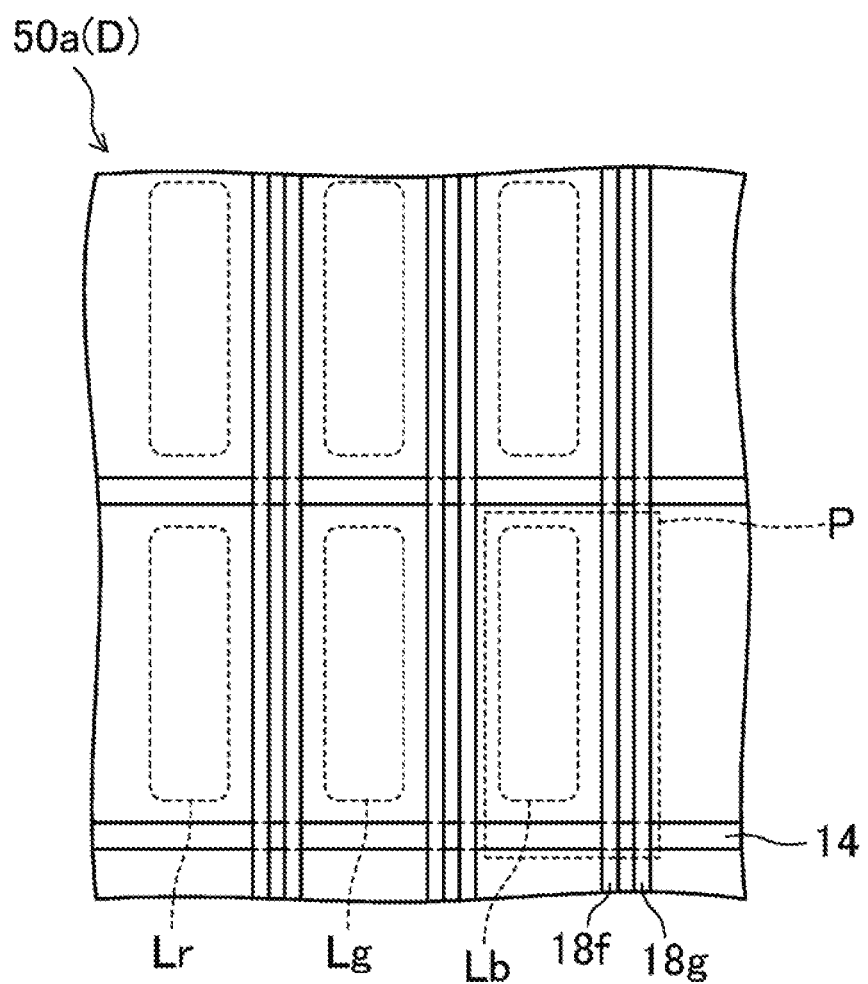
FIG. 2 is a plan view of a display region of the organic EL display device according to the first embodiment of the disclosure.
Figure 3:
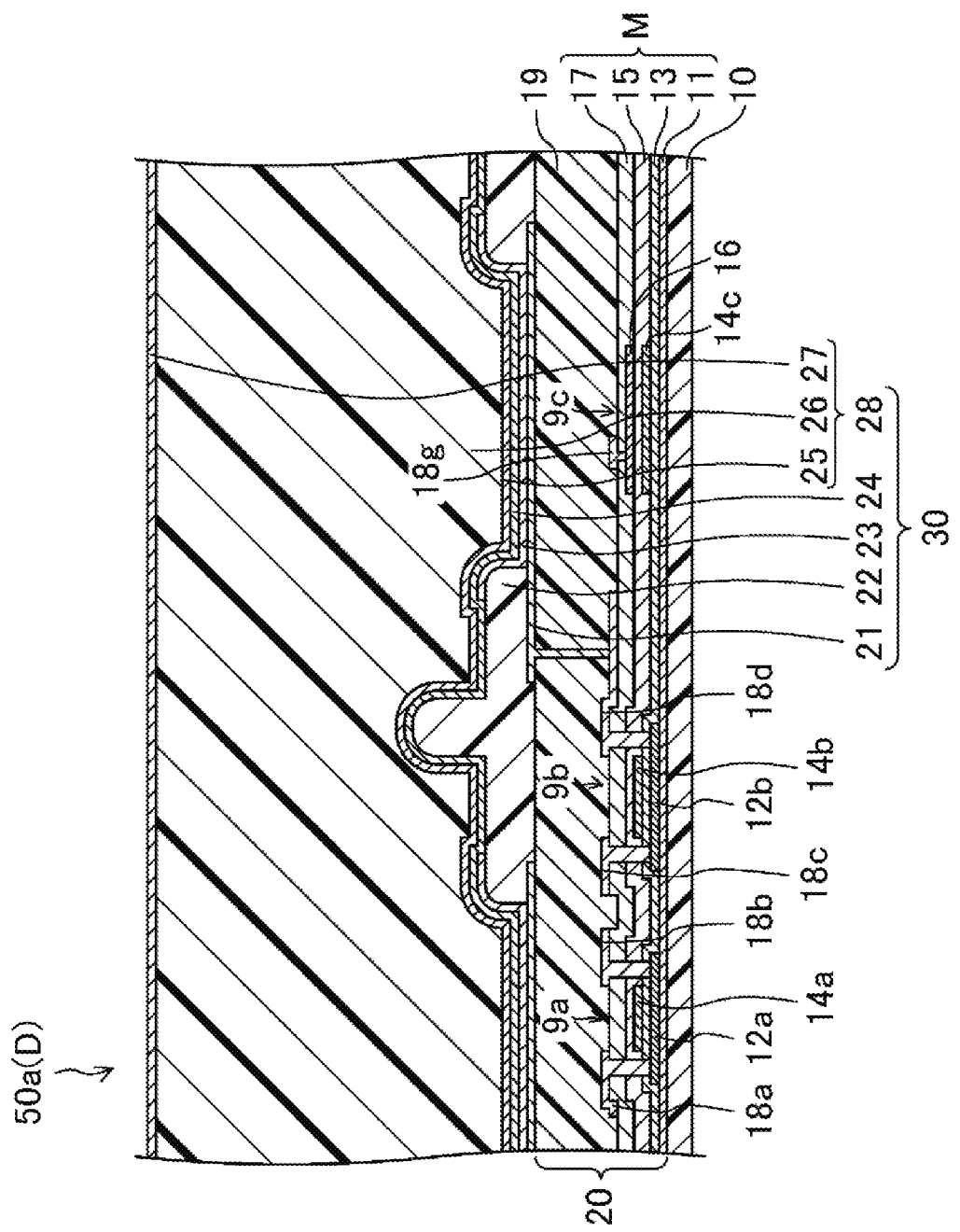
FIG. 3 is a cross-sectional view of the display region of the organic EL display device according to the first embodiment of the disclosure.
Figure 4:
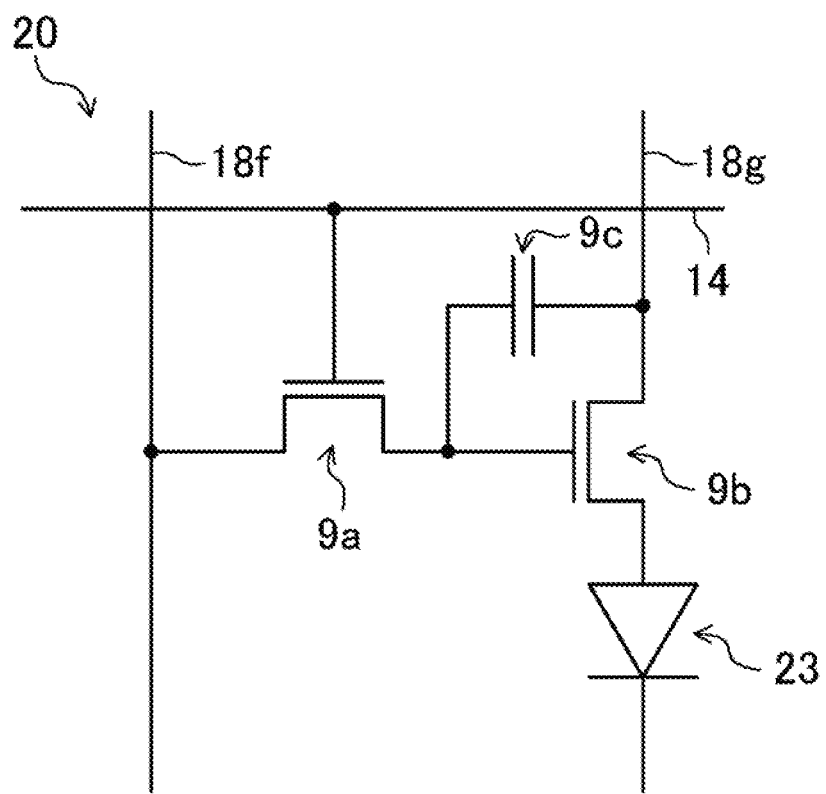
FIG. 4 is an equivalent circuit diagram of a TFT layer configuring the organic EL display device according to the first embodiment of the disclosure.
Figure 5:
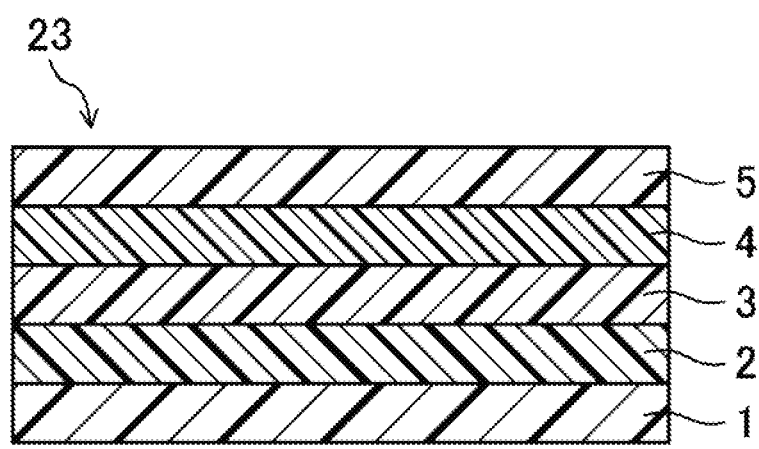
FIG. 5 is a cross-sectional view of an organic EL layer configuring the organic EL display device according to the first embodiment of the disclosure.
Figure 6:
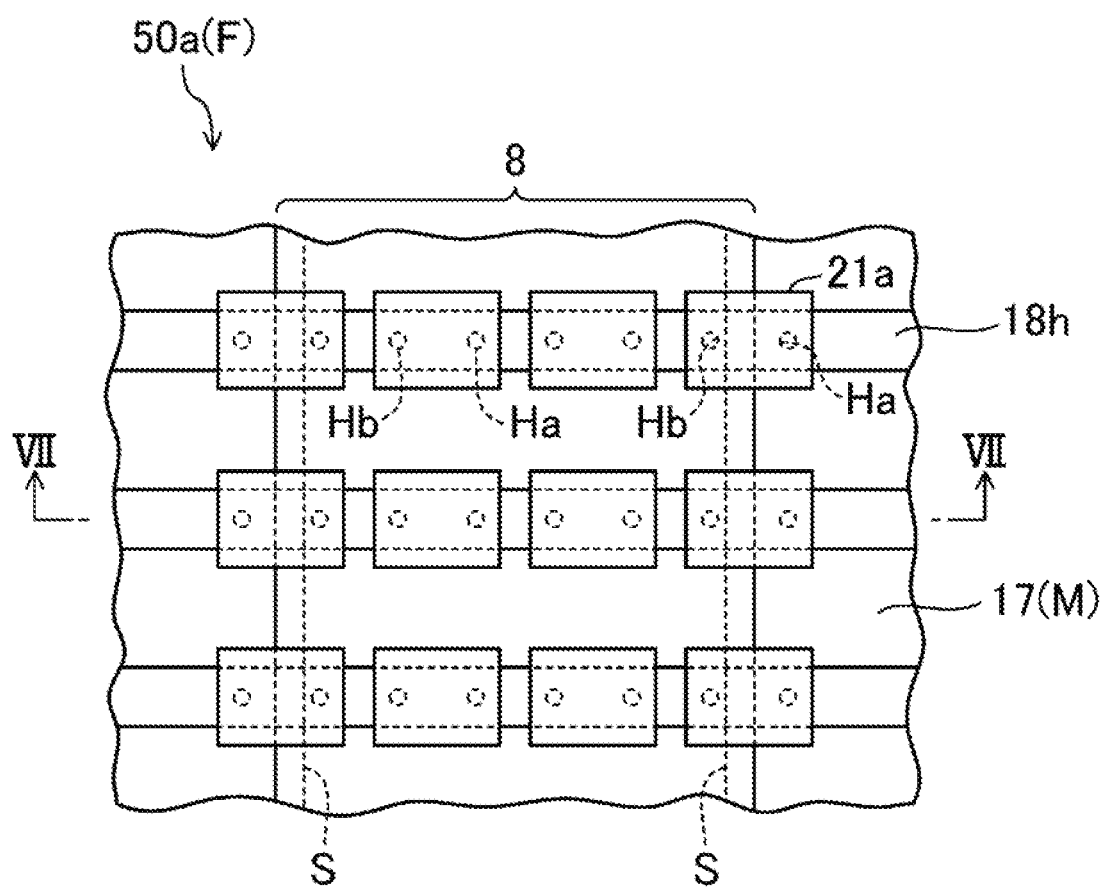
FIG. 6 is a plan view of a frame region of the organic EL display device according to the first embodiment of the disclosure.
Figure 7:
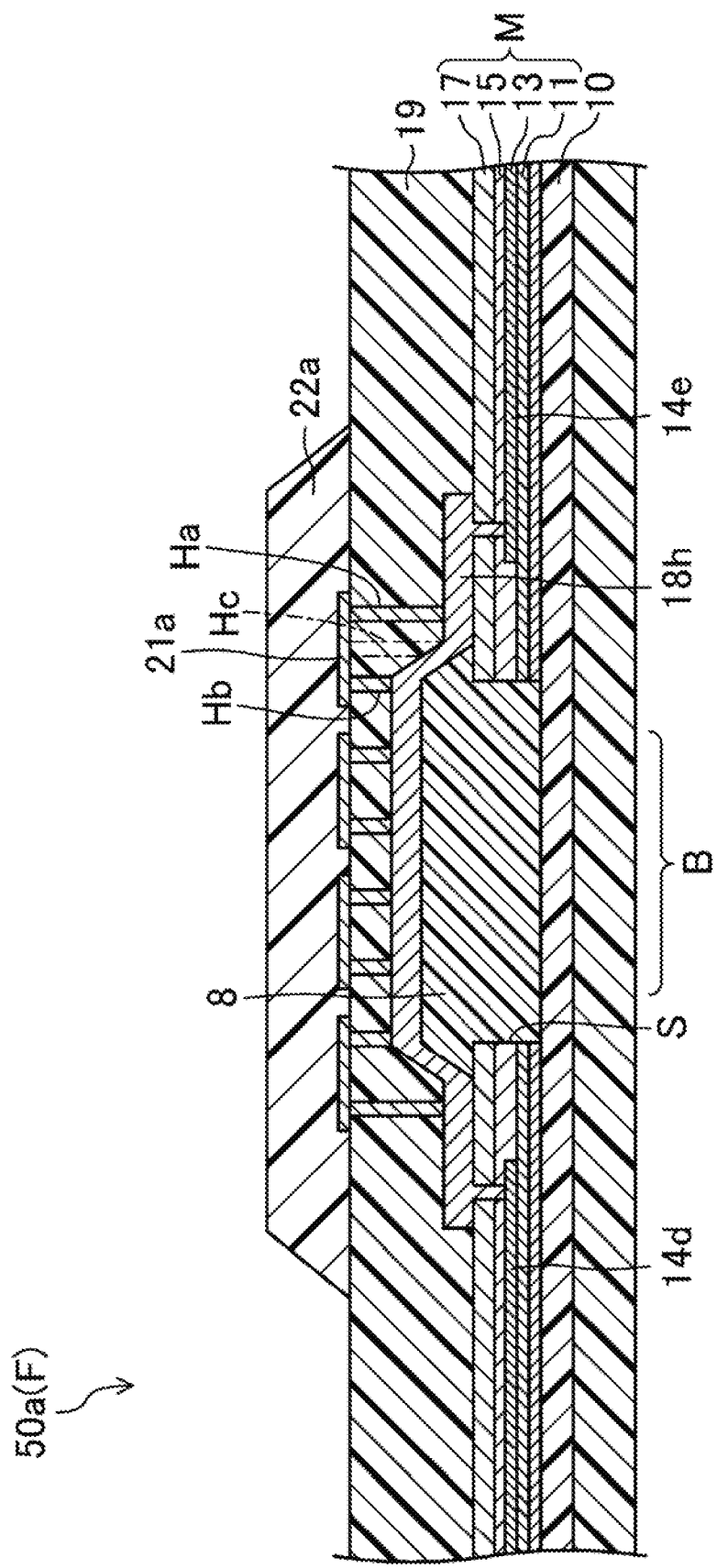
FIG. 7 is a cross-sectional view of the frame region of the organic EL display device taken along the line VII-VII in FIG. 6.

FIG. 1 to FIG. 7 illustrate a display device according to a first embodiment of the disclosure. Note that, in each of the following embodiments, an organic EL display device including an organic EL element will be described as a display device including a light-emitting element. Here, FIG. 1 is a plan view illustrating an overall configuration of an organic EL display device 50a according to the present embodiment. FIG. 2 is a plan view of a display region D of the organic EL display device 50a. Further, FIG. 3 is a cross-sectional view of the display region D of the organic EL display device 50a. Further, FIG. 4 is an equivalent circuit diagram illustrating a TFT layer 20 configuring the organic EL display device 50a. Further, FIG. 5 is a cross-sectional view of an organic EL layer 23 configuring the organic EL display device 50a. Further, FIG. 6 is a plan view of a frame region F of the organic EL display device 50a. Further, FIG. 7 is a cross-sectional view of the frame region F of the organic EL display device 50a taken along the line VII-VII in FIG. 6.

As illustrated in FIG. 1, the organic EL display device 50a includes the display region D having a rectangular shape and configured to display an image, and the frame region F provided around the display region D.

As illustrated in FIG. 2, a plurality of subpixels P are arranged in a matrix shape in the display region D. Further, as illustrated in FIG. 2, in the display region D, the subpixel P including a red light-emitting region Lr for performing red color display, the subpixel P including a green light-emitting region Lg for performing green color display, and the subpixel P including a blue light-emitting region Lb for performing blue color display are provided adjacent to one another. Note that, in the display region D, one pixel is configured by the three adjacent subpixels P including the red light-emitting region Lr, the green light-emitting region Lg, and the blue light-emitting region Lb, for example.

A terminal portion T is provided in a right end portion of the frame region F, as illustrated in FIG. 1. Further, as illustrated in FIG. 1, in the frame region F, a bending portion B that is bendable to 180 degrees (in a U-shape) about a bending axis, which is the vertical direction in the drawing, is provided between the display region D and the terminal portion T so as to extend in one direction (the vertical direction in the drawing).

As illustrated in FIG. 3, the organic EL display device 50a includes, in the display region D, a resin substrate layer 10 provided as a resin substrate, a thin film transistor (TFT) layer 20 provided on the resin substrate layer 10, and an organic EL element 30 provided on the TFT layer 20 as a light-emitting element that configures the display region D.

The resin substrate layer 10 is formed, for example, of a polyimide resin or the like.

As illustrated in FIG. 3, the TFT layer 20 includes a base coat film 11 provided on the resin substrate layer 10, a plurality of first TFTs 9a, a plurality of second TFTs 9b, and a plurality of capacitors 9c that are provided on the base coat film 11, and a second flattening film 19 provided on each of the first TFTs 9a, each of the second TFTs 9b, and each of the capacitors 9c. Note that a first flattening film 8 is provided in the frame region F, as described below. Here, in the TFT layer 20, as illustrated in FIG. 2 and FIG. 4, a plurality of gate lines 14 are provided so as to extend parallel to each other in the lateral direction in the drawings. Further, in the TFT layer 20, as illustrated in FIG. 2 and FIG. 4, a plurality of source lines 18f are provided so as to extend parallel to each other in the vertical direction in the drawings. Further, in the TFT layer 20, as illustrated in FIG. 2 and FIG. 4, a plurality of power source lines 18g are provided so as to extend parallel to each other in the vertical direction in the drawings. Note that, as illustrated in FIG. 2, each of the power source lines 18g is provided so as to be adjacent to each of the source lines 18f. Further, in the TFT layer 20, as illustrated in FIG. 4, each of the subpixels P includes the first TFT 9a, the second TFT 9b, and the capacitor 9c.

The base coat film 11 is composed of a single-layer film or a layered film of an inorganic insulating film of, for example, silicon nitride, silicon oxide, silicon oxide nitride, or the like.

The first TFT 9a is connected to the corresponding gate line 14 and source line 18f in each of the subpixels P, as illustrated in FIG. 4. Further, as illustrated in FIG. 3, the first TFT 9a includes a semiconductor layer 12a, a gate insulating film 13, a gate electrode 14a, a first interlayer insulating film 15, a second interlayer insulating film 17, and a source electrode 18a and a drain electrode 18b, which are provided sequentially in that order on the base coat film 11. Here, as illustrated in FIG. 3, the semiconductor layer 12a is provided in an island shape on the base coat film 11, and includes a channel region, a source region, and a drain region. Further, as illustrated in FIG. 3, the gate insulating film 13 is provided so as to cover the semiconductor layer 12a. Further, as illustrated in FIG. 3, the gate electrode 14a is provided on the gate insulating film 13 so as to overlap with the channel region of the semiconductor layer 12a. Further, as illustrated in FIG. 3, the first interlayer insulating film 15 and the second interlayer insulating film 17 are provided sequentially in that order so as to cover the gate electrode 14a. Further, as illustrated in FIG. 3, the source electrode 18a and the drain electrode 18b are provided on the second interlayer insulating film 17 so as to be separated from each other. Further, as illustrated in FIG. 3, the source electrode 18a and the drain electrode 18b are connected to the source region and the drain region of the semiconductor layer 12a, respectively, via respective contact holes formed in a layered film of the gate insulating film 13, the first interlayer insulating film 15, and the second interlayer insulating film 17. Note that the gate insulating film 13, the first interlayer insulating film 15, and the second interlayer insulating film 17 are each formed by a single-layer film or a layered film of an inorganic insulating film of, for example, silicon nitride, silicon oxide, silicon oxynitride, or the like.

The second TFT 9b is connected to the corresponding first TFT 9a and power source line 18g in each of the subpixels P, as illustrated in FIG. 4. Further, as illustrated in FIG. 3, the first TFT 9b includes a semiconductor layer 12b, the gate insulating film 13, a gate electrode 14b, the first interlayer insulating film 15, the second interlayer insulating film 17, and a source electrode 18c and a drain electrode 18d, which are provided sequentially in that order on the base coat film 11. Here, as illustrated in FIG. 3, the semiconductor layer 12b is provided in an island shape on the base coat film 11, and includes a channel region, a source region, and a drain region. Further, as illustrated in FIG. 3, the gate insulating film 13 is provided so as to cover the semiconductor layer 12b. Further, as illustrated in FIG. 3, the gate electrode 14b is provided on the gate insulating film 13 so as to overlap with the channel region of the semiconductor layer 12b. Further, as illustrated in FIG. 3, the first interlayer insulating film 15 and the second interlayer insulating film 17 are provided sequentially in that order so as to cover the gate electrode 14b. Further, as illustrated in FIG. 3, the source electrode 18c and the drain electrode 18d are provided on the second interlayer insulating film 17 so as to be separated from each other. Further, as illustrated in FIG. 3, the source electrode 18c and the drain electrode 18d are connected to the source region and the drain region of the semiconductor layer 12b, respectively, via respective contact holes formed in the layered film of the gate insulating film 13, the first interlayer insulating film 15, and the second interlayer insulating film 17.

Note that in the present embodiment, the first TFT 9a and the second TFT 9b are exemplified as being of a top-gate type, but the first TFT 9a and the second TFT 9b may be a bottom-gate type TFT.

The capacitor 9c is connected to the corresponding first TFT 9a and power source line 18g in each of the subpixels P, as illustrated in FIG. 4. Here, as illustrated in FIG. 3, the capacitor 9c includes a lower conductive layer 14c formed of the same material as and in the same layer as the gate electrodes 14a and 14b, the first interlayer insulating film 15 that is provided so as to cover the lower conductive layer 14c, and an upper conductive layer 16 that is provided on the first interlayer insulating film 15 so as to overlap with the lower conductive layer 14c. Note that, as illustrated in FIG. 3, the upper conductive layer 16 is connected to the power source line 18g via a contact hole formed in the second interlayer insulating film 17.

The second flattening film 19 has a flat surface in the display region D and is formed of, for example, an organic resin material, such as a polyimide resin.

As illustrated in FIG. 3, the organic EL element 30 includes a plurality of first electrodes 21, an edge cover 22, a plurality of organic EL layers 23, a second electrode 24, and a sealing film 28, which are provided sequentially in that order on the second flattening film 19.

As illustrated in FIG. 3, the plurality of first electrodes 21 are provided as pixel electrodes, in a matrix shape on the second flattening film 19 so as to correspond to the plurality of subpixels P. Further, as illustrated in FIG. 3, each of the first electrodes 21 is connected to the drain electrode 18d of each of the second TFTs 9b via a contact hole formed in the second flattening film 19. Further, the first electrode 21 functions to inject holes (positive holes) into the organic EL layer 23. Further, the first electrode 21 is preferably formed of a material having a large work function to improve the efficiency of the hole injection into the organic EL layer 23. Here, examples of materials that may be included in the first electrode 21 include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Further, the materials included in the first electrode 21 may be an alloy such as astatine (At)/astatine oxide ($AtO_2$), for example. Furthermore, the materials included in the first electrode 21 may be electrically conductive oxides such as tin oxide (SnO), zinc oxide (ZnO), indium tin oxide (ITO), and indium zinc oxide (IZO), for example. Further, the first electrode 21 may be formed by layering a plurality of layers formed of any of the materials described above. Note that examples of materials having a large work function include indium tin oxide (ITO) and indium zinc oxide (IZO).

As illustrated in FIG. 3, the edge cover 22 is provided in a lattice pattern so as to cover a peripheral portion of each of the first electrodes 21. Here, examples of materials that may be included in the edge cover 22 include an organic film of, for example, a polyimide resin, an acrylic resin, a polysiloxane resin, a novolak resin, or the like.

As illustrated in FIG. 3, the plurality of organic EL layers 23 are disposed on each of the first electrodes 21, and provided in a matrix shape so as to correspond to the plurality of subpixels P. Here, as illustrated in FIG. 5, each of the organic EL layers 23 includes a hole injection layer 1, a hole transport layer 2, a light-emitting layer 3, an electron transport layer 4, and an electron injection layer 5, which are provided sequentially in that order on the first electrode 21.

The hole injection layer 1 is also referred to as an anode electrode buffer layer, and functions to reduce an energy level difference between the first electrode 21 and the organic EL layer 23 to thereby improve the efficiency of hole injection into the organic EL layer 23 from the first electrode 21. Examples of materials that may be included in the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 21 to the organic EL layer 23. Here, examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 21 and the second electrode 24, respectively, and the holes and the electrons recombine, when a voltage is applied via the first electrode 21 and the second electrode 24. Here, the light-emitting layer 3 is formed of a material having high luminous efficiency. Then, examples of materials that may be included in the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Here, examples of materials that may be included in the electron transport layer 4 include oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 30 by this function. Note that the electron injection layer 5 is also referred to as a cathode buffer layer. Here, examples of materials that may be included in the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 3, the second electrode 24 is provided as a common electrode, so as to cover each of the organic EL layers 23 and the edge cover 22. The second electrode 24 functions to inject electrons into the organic EL layer 23. The second electrode 24 is preferably formed of a material having a small work function to improve the efficiency of electron injection into the organic EL layer 23. Here, examples of materials that may be included in the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further, the second electrode 24 may be formed of an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. Further, the second electrode 24 may be formed of an electrically conductive oxide such as tin oxide (SnO), zinc oxide (ZnO), indium tin oxide (ITO), and indium zinc oxide (IZO). Further, the second electrode 24 may be formed by layering a plurality of layers of any of the materials described above. Note that, examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 3, the sealing film 28 includes a first inorganic film 25 provided so as to cover the second electrode 24, an organic film 26 provided on the first inorganic film 25, and a second inorganic film 27 provided so as to cover the organic film 26, and functions to protect the organic EL layer 23 from moisture, oxygen, and the like. Here, examples of materials that may be included in the first inorganic film 25 and the second inorganic film 27 include an inorganic material such as silicon oxide ($SiO_2$), aluminum oxide ($Al_2O_3$), silicon nitride (SiNx (x denoting a positive integer)) like trisilicon tetranitride ($Si_3N_4$), and silicon carbide nitride (SiCN). Further, the organic film 26 is formed of an organic material such as an acrylic resin, a polyurea resin, a parylene resin, a polyimide resin, and a polyamide resin, for example.

Further, as illustrated in FIG. 6 and FIG. 7, the organic EL display device 50a includes, in the frame region F, the resin substrate layer 10, an inorganic insulating layered film M provided on the resin substrate layer 10, the first flattening film 8, a lead wiring line 18h, the second flattening film 19, a plurality of conductive layers 21a, and a resin layer 22a. Note that in a plan view in FIG. 6, the second flattening film 19 and the resin layer 22a are omitted, which are disposed over the entire surface of the drawing.

The inorganic insulating layered film M is at least one of inorganic insulating layers configuring the TFT layer 20, and includes, as illustrated in FIG. 7, the base coat film 11, the gate insulating film 13, the first interlayer insulating film 15, and the second interlayer insulating film 17, which are sequentially layered in that order on the resin substrate layer 10. Here, as illustrated in FIG. 6 and FIG. 7, in the bending portion B, a slit S is formed, in the inorganic insulating layered film M, that penetrates the inorganic insulating layered film M and exposes the upper face of the resin substrate layer 10. Note that the slit S is provided in a groove shape penetrating along the extending direction of the bending portion B.

As illustrated in FIG. 6 and FIG. 7, the first flattening film 8 is provided so as to fill the slit S. Here, the first flattening film 8 is formed of an organic resin material such as a polyimide resin, for example.

As illustrated in FIG. 6 and FIG. 7, the lead wiring line 18h is continuously provided on the first flattening film 8 and both end portions of the inorganic insulating layered film M, the slit S being formed at both the end portions. Further, as illustrated in FIG. 6 and FIG. 7, a plurality of the lead wiring lines 18h are provided so as to extend in parallel to each other in a direction orthogonal to the direction in which the bending portion B extends. Further, as illustrated in FIG. 7, both end portions of each of the lead wiring lines 18h are electrically connected to the first gate conductive layer 14d and the second gate conductive layer 14e, respectively, via respective contact holes formed in a layered film of the first interlayer insulating film 15 and the second interlayer insulating film 17. Here, the lead wiring line 18h is formed of the same material as and in the same layer as a source line 18a and the like. Further, the second flattening film 19 is provided on the lead wiring line 18h. Further, as illustrated in FIG. 7, the first gate conductive layer 14d is provided between the gate insulating film 13 and the first interlayer insulating film 15, and is electrically connected to signal wiring lines (the gate line 14, the source line 18f, the power supply line 18g, and the like) of the TFT layer 20 in the display region D. Further, as illustrated in FIG. 7, the second gate conductive layer 14e is provided between the gate insulating film 13 and the first interlayer insulating film 15, and extends to the terminal portion T.

As illustrated in FIG. 6 and FIG. 7, the plurality of conductive layers 21a are each formed in a rectangular island shape and are provided in a matrix shape on the second flattening film 19. Here, each of the conductive layers 21a is formed of the same material as and in the same layer as the first electrode 21. Further, as illustrated in FIG. 6, of the plurality of conductive layers 21a, each of the conductive layers 21a arranged in one row in the lateral direction in FIG. 6 is provided so as to overlap with each of the corresponding lead wiring lines 18h. Furthermore, as illustrated in FIG. 6 and FIG. 7, each of the lead wiring lines 18h and the corresponding conductive layer 21a are electrically connected via a first contact hole Ha and a second contact hole Hb formed in the second flattening film 19. Note that in the present embodiment, although a configuration is exemplified in which the lead wiring line 18h and the conductive layer 21a are electrically connected via the first contact hole Ha and the second contact hole Hb, the lead wiring line 18h and the conductive layer 21a may be electrically connected via the first contact hole Ha, the second contact hole Hb, and a third contact hole Hc (see the two-dot chain line in FIG. 7). Further, in the present embodiment, although a configuration is exemplified in which the lead wiring line 18h and the conductive layer 21a are each electrically connected via the single first contact hole Ha and the single second contact hole Hb, a plurality of the first contact holes Ha and the second contact holes Hb may be formed for each of the conductive layers 21a, and a third wiring line layer 18ic and the conductive layer 21a may be electrically connected via the plurality of first contact holes Ha and the plurality of second contact holes Hb.

As illustrated in FIG. 7, the resin layer 22a is provided on the second flattening film 19 so as to cover each of the conductive layers 21a. Here, the resin layer 22a is formed of the same material as and in the same layer as the edge cover 22.

In the organic EL display device 50a described above, in each of the subpixels P, a gate signal is input into the first TFT 9a via the gate line 14 to turn on the first TFT 9a, a predetermined voltage corresponding to a source signal is written in the gate electrode 14b of the second TFT 9b and the capacitor 9c via the source line 18f, the magnitude of current from the power source line 18g is specified based on a gate voltage of the second TFT 9b, and the specified current is supplied to the organic EL layer 23, whereby the light-emitting layer 3 of the organic EL layer 23 emits light to display an image. Note that in the organic EL display device 50a, even when the first TFT 9a is turned off, the gate voltage of the second TFT 9b is held by the capacitor 9c. Thus, the light emission by the light-emitting layer 3 is maintained until the gate signal of the next frame is input.

Next, a method of manufacturing the organic EL display device 50a according to the present embodiment will be described. Note that the method of manufacturing the organic EL display device 50a according to the present embodiment includes a TFT layer forming step and an organic EL element forming step.

TFT Layer Forming Step

For example, using a known method, the TFT layer 20 is formed by forming the base coat film 11, the first TFT 9a, the second TFT 9b, the capacitor 9c, and the second flattening film 19 on a surface of the resin substrate layer 10, which is formed on a glass substrate.

Here, when forming the first TFT 9a and the second TFT 9b, before forming the source electrode 18a and the like, in the bending portion B of frame region F, by removing the layered film of the base coat film 11, the gate insulating film 13, the first interlayer insulating film 15, and the second interlayer insulating film 17 using dry etching, the slit S is formed. After that, the first flattening film 8 is formed to fill the slit S. After that, when forming the source electrode 18a and the like, the lead wiring line 18h is formed simultaneously.

Organic EL Element Forming Step

First, on the second flattening film 19 of the TFT layer 20, which is formed in the TFT layer forming step described above, using a known method, the first electrode 21, the edge cover 22, the organic EL layer 23 (the hole injecting layer 1, the hole transport layer 2, the light-emitting layer 3, the electron transport layer 4, and the electron injecting layer 5), and the second electrode 24 are formed. Here, when forming the first electrode 21, the conductive layer 21a is formed simultaneously, and when forming the edge cover 22, the resin layer 22a is formed simultaneously.

Next, on the surface of the substrate on which the second electrode 24 is formed, the first inorganic film 25 is formed using a mask, for example, by forming an inorganic insulating film such as a silicon nitride film, a silicon oxide film, and a silicon oxynitride film, using a plasma chemical vapor deposition (CVD) method.

After that, on the surface of the substrate on which the first inorganic film 25 is formed, the organic film 26 is formed through film formation of an organic resin material, such as an acrylic resin, for example, using an ink-jet method.

Further, with respect to the substrate on which the organic film 26 is formed, the second inorganic film 27 is formed using a mask, for example, by forming an inorganic insulating film, such as a silicon nitride film, a silicon oxide film, and a silicon oxynitride film, using the plasma CVD method. In this way, the sealing film 28 including the first inorganic film 25, the organic film 26, and the second inorganic film 27 is formed to form the organic EL element 30.

Finally, after affixing a protective sheet (not illustrated) to the surface of the substrate on which the organic EL element 30 is formed, the glass substrate is peeled off from the lower face of the resin substrate layer 10 by irradiating the glass substrate side of the resin substrate layer 10 with laser light, and a protective sheet (not illustrated) is further applied to the lower face of the resin substrate layer 10 from which the glass substrate has been peeled off.

The organic EL display device 50a of the present embodiment can be manufactured in the above-described manner.

As described above, according to the organic EL display device 50a of the present embodiment, the second flattening film 19 is provided on each of the lead wiring lines 18h disposed in the frame region F. Then, the plurality of conductive layers 21a are provided in the matrix shape on the second flattening film 19. Here, the lead wiring lines 18h and each of the conductive layers 21a overlapping with the lead wiring lines 18h are electrically connected via the first contact hole Ha and the second contact hole Hb formed in the second flattening film 19. As a result, even if the lead wiring line 18h is broken, as a result of the conductive layer 21a being disposed so as to bridge the broken section, conduction of the broken lead wiring line 18h can be secured. Thus, it is possible to provide redundancy for the lead wiring line 18h disposed in the frame region F.

Second Embodiment

Figure 8:
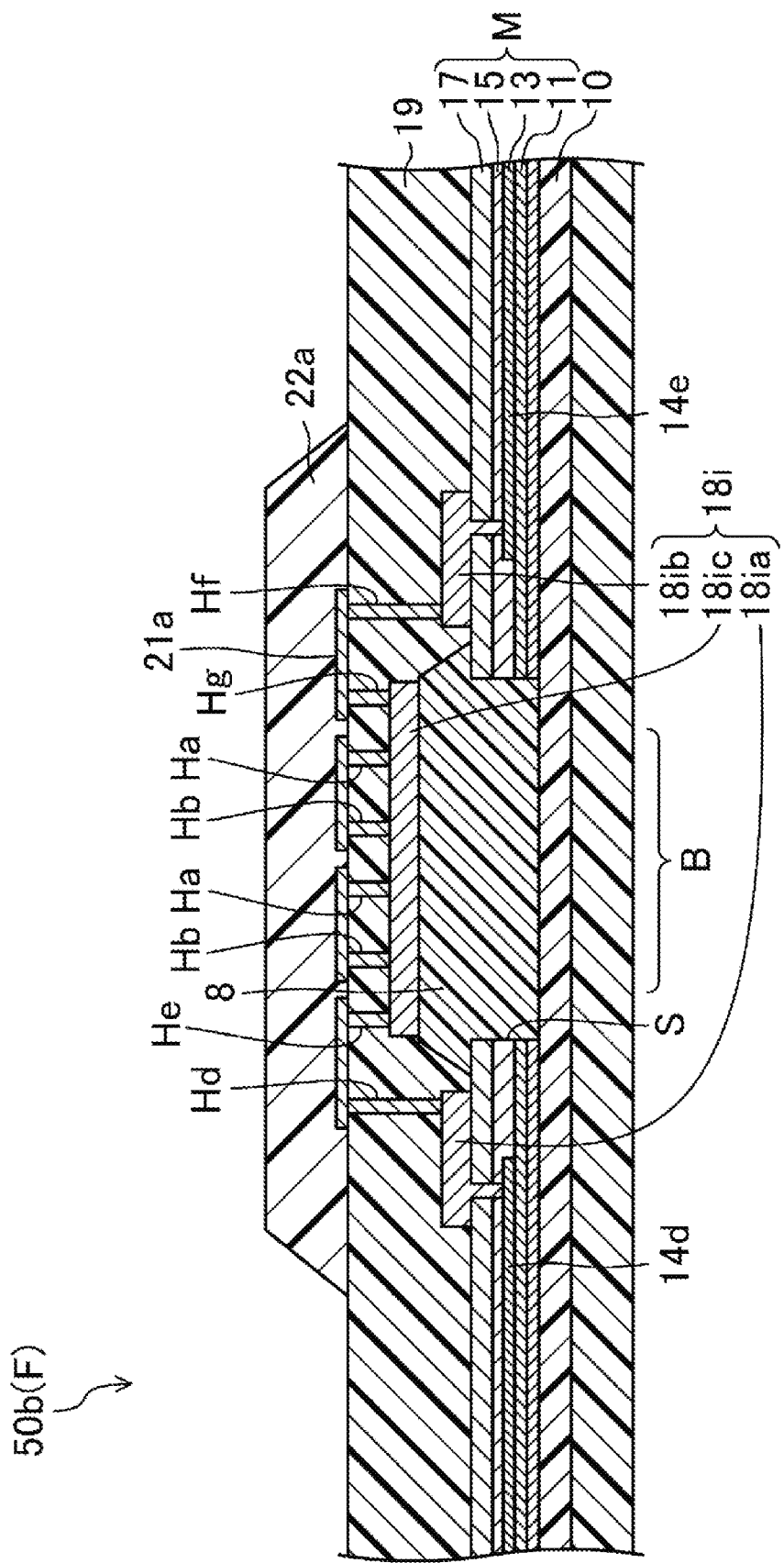
FIG. 8 is a cross-sectional view of the frame region of an organic EL display device according to a second embodiment of the disclosure, and is a diagram corresponding to FIG. 7.

FIG. 8 illustrates a second embodiment of a display device according to the disclosure. Here, FIG. 8 is a cross-sectional view illustrating the frame region F of an organic EL display device 50b according to the present embodiment, and is a diagram corresponding to FIG. 7. In the following embodiments, parts identical to those in FIG. 1 to FIG. 7 will be denoted by the same reference signs, and a detailed description thereof will be omitted.

In the first embodiment described above, the organic EL display device 50a is exemplified in which the lead wiring lines 18h, each including a metal layer, are provided at both end portions of the first flattening film 8. However, in the present embodiment, an organic EL display device 50b is exemplified in which lead wiring lines 18i, which do not include the metal layer, are provided at both the end portions of the first flattening film 8.

Similarly to the organic EL display device 50a of the first embodiment described above, the organic EL display device 50b is provided with the display region D and the frame region F provided around the display region D.

Similarly to the organic EL display device 50a of the first embodiment described above, the organic EL display device 50b is provided with the resin substrate layer 10, the TFT layer 20 provided on the resin substrate layer 10, and the organic EL element 30 provided on the TFT layer 20.

As illustrated in FIG. 8, the organic EL display device 50b includes the resin substrate layer 10, the inorganic insulating layered film M provided on the resin substrate layer 10, the first flattening film 8, the lead wiring lines 18$i$, the second flattening film 19, the plurality of conductive layers 21$a$, and the resin layer 22$a$.

As illustrated in FIG. 8, the lead wiring line 18$i$ includes a first wiring line layer 18$ia$ provided on one of the end portion of the inorganic insulating layered film M in which the slit S is formed, a second wiring line layer 18$ib$ provided on the other end portion of the inorganic insulating layered film M in which the slit S is formed, and the third wiring line layer 18$ic$ provided on the first flattening film 8. Further, the plurality of lead wiring lines 18$i$ are provided so as to extend parallel to each other in a direction orthogonal to the direction in which the bending portion B extends. Here, the first wiring line layer 18$ia$, the second wiring line layer 18$ib$, and the third wiring line layer 18$ic$ are formed by the same material as and in the same layer as the source electrode 18$a$ and the like. Further, as illustrated in FIG. 8, the second flattening film 19 is provided on the first wiring line layer 18$ia$, the second wiring line layer 18$ib$, and the third wiring line layer 18$ic$.

As illustrated in FIG. 8, one end portion (on the left side in the drawing) of the first wiring line layer 18$ia$ is electrically connected to the first gate conductive layer 14$d$ via a contact hole formed in the layered film of the first interlayer insulating film 15 and the second interlayer insulating film 17. Further, as illustrated in FIG. 8, the other end portion (on the right side in the drawing) of the first wiring line layer 18$ia$ is electrically connected to the corresponding conductive layer 21$a$ via a contact hole Hd formed in the second flattening film 19. Note that in FIG. 8, a configuration is exemplified in which the first wiring line layer 18$ia$ and the conductive layer 21$a$ are electrically connected via the single contact hole Hd, but a plurality of the contact holes Hd may be formed, and the first wiring line layer 18$ia$ and the conductive layer 21$a$ may be electrically connected via the plurality of contact holes Hd.

As illustrated in FIG. 8, one end portion (on the right side in the drawing) of the second wiring line 18$ib$ is connected to the second gate conductive layer 14$e$ via a contact hole formed in the layered film of the first interlayer insulating film 15 and the second interlayer insulating film 17. Further, as illustrated in FIG. 8, the other end portion (on the left side in the drawing) of the second wiring line layer 18$ib$ is electrically connected to the corresponding conductive layer 21$a$ via a contact hole Hf formed in the second flattening film 19. Note that in FIG. 8, a configuration is exemplified in which the second wiring line layer 18$ib$ and the conductive layer 21$a$ are electrically connected via the single contact hole Hf, but a plurality of the contact holes Hf may be formed, and the second wiring line layer 18$ib$ and the conductive layer 21$a$ may be electrically connected via the plurality of contact holes Hf.

As illustrated in FIG. 8, one end portion of the third wiring line layer 18$ic$ (on the left side in the drawing) is electrically connected to the corresponding conductive layer 21$a$ via a contact hole He formed in the second flattening film 19. Note that in FIG. 8, a configuration is exemplified in which the third wiring line layer 18$ic$ and the conductive layer 21$a$ are electrically connected via the single contact hole He, but a plurality of the contact holes He may be formed, and the third wiring line layer 18$ic$ and the conductive layer 21$a$ may be electrically connected via the plurality of contact holes He. Further, as illustrated in FIG. 8, the other end portion (on the right side in the drawing) of the third wiring line layer 18$ic$ is electrically connected to the corresponding conductive layer 21$a$ via a contact hole Hg formed in the second flattening film 19. Note that in FIG. 8, a configuration is exemplified in which the third wiring line layer 18$ic$ and the conductive layer 21$a$ are electrically connected via the one contact hole Hg, but a plurality of the contact holes Hg may be formed, and the third wiring line layer 18$ic$ and the conductive layer 21$a$ may be electrically connected via the plurality of contact holes Hg. Further, as illustrated in FIG. 8, an intermediate portion of the third wiring line layer 18$ic$ is electrically connected to the corresponding conductive layer 21$a$ via the first contact hole Ha and the second contact hole Hb formed in the second flattening film 19. Here, as illustrated in FIG. 8, the first wiring line layer 18$ia$ and the third wiring line layer 18$ic$ are separated from each other at one end portion (on the left side in the drawing) of the first flattening film 8, and the second wiring line layer 18$ib$ and the third wiring line layer 18$ic$ are separated from each other at the other end portion (on the right side in the drawing) of the first flattening film 8. In other words, at both the end portions of the first flattening film 8, a metal layer is provided that is formed by the same material as and in the same layer as the source electrode 18$a$ and the like.

Similarly to the organic EL display device 50$a$ of the first embodiment, the organic EL display device 50$b$ described above is flexible and is configured to display an image by causing the light-emitting layer 3 of the organic EL layer 23 to emit light as required, via the first TFT 9$a$ and the second TFT 9$b$ in each of the subpixels P.

The organic EL display device 50$b$ of the present embodiment can be manufactured by modifying a pattern shape of the lead wiring lines 18$h$ in the method of manufacturing the organic EL display device 50$a$ of the first embodiment.

As described above, according to the organic EL display device 50$b$ of the present embodiment, the second flattening film 19 is provided on each of the lead wiring lines 18$i$ disposed in the frame region F. Then, the plurality of conductive layers 21$a$ are provided in the matrix shape on the second flattening film 19. Here, the lead wiring lines 18$i$ and each of the conductive layers 21$a$ overlapping with the lead wiring lines 18$i$ are electrically connected via the contact holes Ha, Hb, and Hd to Hg formed in the second flattening film 19. As a result, even if the lead wiring line 18$i$ is broken, as a result of the conductive layer 21$a$ being disposed so as to bridge the broken section, conduction of the broken lead wiring line 18$i$ can be secured. Thus, it is possible to provide redundancy for the lead wiring line 18$i$ disposed in the frame region F.

Further, according to the organic EL display device 50$b$ of the present embodiment, each of the lead wiring lines 18$i$ is provided with the first wiring line layer 18$ia$ provided on one of the end portions of the inorganic insulating layered film M in which the slit S is formed, the second wiring line layer 18$ib$ provided on the other end portion of the inorganic insulating layered film M in which the slit S is formed, and the third wiring line layer 18$ic$ provided on the first flattening film 8. Here, both the end portions of the first flattening film 8 are disposed between the first wiring line layer 18$ia$ and the third wiring line layer 18$ic$, and between the second wiring line layer 18$ib$ and the third wiring line layer 18$ic$. Thus, when forming the lead wiring line 18$i$, a metal film is formed so as to cover the first flattening film 8, and a resist pattern formed on the metal film does not overlap with both the end portions of the first flattening film 8. As a result, the metal film (source metal) used when forming the lead wiring line 18$i$ is less likely to remain on both the end portions of the first flattening film 8, and a short circuit between the adjacent lead wiring lines 18*i* caused by the residue of the source metal can thus be suppressed.

Other Embodiments

In each of the embodiments described above, the organic EL layer is exemplified that has a five-layer structure including the hole injection layer, the hole transport layer, the light-emitting layer, the electron transport layer, and the electron injection layer. However, the organic EL layer may have a three-layer structure including a hole injection-cum-transport layer, the light-emitting layer, and an electron transport-cum-injection layer, for example.

Further, in each of the embodiments described above, the organic EL display device is exemplified that includes the first electrode as the anode electrode and the second electrode as the cathode electrode. However, the disclosure is also applicable to an organic EL display device in which the layers of the structure of the organic EL layer are in the reverse order, with the first electrode being the cathode electrode and the second electrode being the anode electrode.

Further, in each of the embodiments described above, the organic EL display device is exemplified in which the electrode of the TFT connected to the first electrode serves as the drain electrode. However, the disclosure is also applicable to an organic EL display device in which the electrode of the TFT connected to the first electrode is referred to as the source electrode.

Further, in each of the embodiments described above, the organic EL display device is described as an example of the display device, but the disclosure is also applicable to a display device provided with a plurality of light-emitting elements that are driven by a current. For example, the disclosure is applicable to a display device provided with quantum dot light-emitting diodes (QLEDs), which are light-emitting elements using a quantum dot-containing layer.

INDUSTRIAL APPLICABILITY

As described above, the disclosure is useful for a flexible display device.

The invention claimed is:

1. A display device comprising:
   a resin substrate;
   a TFT layer provided on the resin substrate;
   a light-emitting element provided on the TFT layer and configuring a display region;
   a frame region provided around the display region;
   a terminal portion provided on an end portion of the frame region;
   a bending portion provided extending in one direction between the display region and the terminal portion;
   at least one inorganic insulating film configuring the TFT layer and provided on the resin substrate; and
   a plurality of wiring lines configuring the TFT layer and provided, in the frame region, extending parallel to each other in a direction intersecting a direction in which the bending portion extends,
   wherein, in the bending portion, a slit is formed penetrating through the at least one inorganic insulating film and exposing the resin substrate,
   a first flattening film is provided filling the slit,
   each of the plurality of wiring lines is provided on the first flattening film and on both end portions of the at least one inorganic insulating film, the slit being formed at both end portions,
   a second flattening film configuring the TFT layer is provided on each of the plurality of wiring lines,
   a plurality of conductive layers each having an island shape are provided on the second flattening film, and
   each of the plurality of wiring lines and a corresponding conductive layer of the plurality of conductive layers are electrically connected via a first contact hole and a second contact hole formed in the second flattening film,
   wherein each of the plurality of wiring lines includes:
   a first wiring line layer provided on one end portion, in which the slit is formed, of the at least one inorganic insulating film;
   a second wiring line layer provided on another end portion, in which the slit is formed, of the at least one inorganic insulating film; and
   a third wiring line layer provided on the first flattening film,
   the first wiring line layer, the second wiring line layer, and the third wiring line layer are formed of the same material in the same layer,
   the first wiring line layer and the third wiring line layer are separated from each other at one end portion of the first flattening film,
   the second wiring line layer and the third wiring line layer are separated from each other at another end portion of the first flattening film,
   the first wiring line layer and the third wiring line layer are electrically connected via the corresponding conductive layer of the plurality of conductive layers, and
   the second wiring line layer and the third wiring line layer are electrically connected via the corresponding conductive layer of the plurality of conductive layers.

2. The display device according to claim 1, wherein the light-emitting element includes a plurality of pixel electrodes provided on the second flattening film, and
   each of the plurality of conductive layers is formed of the same material as and in the same layer as each of the plurality of pixel electrodes.

3. The display device according to claim 2,
   wherein the light-emitting element includes an edge cover provided so as to cover a peripheral end portion of each of the plurality of pixel electrodes, and
   each of the plurality of conductive layers is covered by a resin layer formed of the same material as and in the same layer as the edge cover.

4. The display device according to claim 1, wherein each of the plurality of wiring lines and the corresponding conductive layer of the plurality of conductive layers overlap each other.

5. The display device according to claim 1, wherein each of the plurality of wiring lines and the corresponding conductive layer of the plurality of conductive layers are electrically connected via a plurality of the first contact holes and a plurality of the second contact holes.

6. The display device according to claim 1, wherein each of the plurality of wiring lines and the corresponding conductive layer of the plurality of conductive layers are formed on the second flattening film and electrically connected via a third contact hole formed between the first contact hole and the second contact hole.

7. The display device according to claim 1,
wherein the first wiring line layer, the third wiring line layer, and the corresponding conductive layer are electrically connected to each other via a plurality of contact holes formed in the second flattening film, and
the second wiring line layer, the third wiring line layer, and the corresponding conductive layer are electrically connected to each other via a plurality of contact holes formed in the second flattening film.

8. The display device according to claim 1, wherein the light-emitting element is an organic EL element.

* * * * *